United States Patent [19]

Orgill

[11] 3,921,011

[45] Nov. 18, 1975

[54] MOS INPUT LATCH CIRCUIT

[75] Inventor: Rodney H. Orgill, Tempe, Ariz.

[73] Assignee: Motorola, Inc., Chicago, Ill.

[22] Filed: June 3, 1974

[21] Appl. No.: 475,535

[52] U.S. Cl. ................ 307/251; 307/215; 307/279; 328/34; 328/164; 328/206

[51] Int. Cl.² .................. H03K 5/153; H03K 17/60

[58] Field of Search ........... 307/215, 251, 263, 279, 307/290, 304; 328/34, 164, 206

[56] References Cited

UNITED STATES PATENTS

| | | | |
|---|---|---|---|
| 3,243,652 | 3/1966 | Meyer et al. | 315/194 |
| 3,825,772 | 7/1974 | Ainsworth | 307/279 X |

*Primary Examiner*—Siegfried H. Grimm
*Attorney, Agent, or Firm*—Harry M. Weiss; Charles R. Hoffman

[57] ABSTRACT

An MOS input latch circuit includes cross-coupled logic gates and MOSFETs coupled between the set and reset inputs of the latch circuit formed by the cross-coupled logic gates. An output MOSFET connected between an output of the MOSFET latch circuit and an output of one of the logic gates. Each of the logic gates has a MOSFET coupled between its two inputs having its gate electrode coupled to $\phi 1$. The input MOSFETs have their gate electrodes coupled to $\phi 2$ conductor and one of their main electrodes of each is connected to complementary input signal conductors.

14 Claims, 5 Drawing Figures

MOS INPUT LATCH CIRCUIT

BACKGROUND OF THE INVENTION

MOSFET LSI circuits (metal oxide semiconductor field effect transistor large scale integrated circuits) have established a position in the electronics industry as a means of achieving high circuit functional densities at relatively low costs for many applications. It is frequently necessary to interface such MOSFET LSI circuits with bipolar logic circuits for other MOSFET LSI circuits which are not satisfactorily synchronized with the subject MOSFET LSI circuit. Conventionally input latch circuits have been utilized to accept the incoming signal, which sets the state of a latch circuit which may be a cross-coupled flip-flop comprised of cross-coupled inverters or cross-coupled logic gates. However, under certain conditions, the outputs of the latch may be required to provide a signal before the state of the latch is well defined. In other circumstances, especially if the basic latch circuit is formed by cross-coupled AND or NOR gates, an indeterminate latch state may occur because a forbidden condition occurs on the set and reset inputs thereof. Such complications may result in improper information being stored in the latch, causing subsequent circuit malfunctions.

SUMMARY OF THE INVENTION

It is an object of this invention to provide an improved input circuit.

It is another object of the invention to provide an improved latch circuit having coupling means for detecting an indeterminate signal level coupled to an input of the latch to cause the latch circuit to settle in a predetermined state.

It is another object of the invention to provide a MOSFET input latch circuit for synchronizing an input signal applied to the input latch circuit to clock signals applied to the latch circuit having MOSFETs coupled from the output of a cross-coupled basic latch circuit to inputs thereof to determine the state of the latch circuit.

Briefly described, the invention is a latch circuit for producing an output signal in response to an input signal including first and second inverting gates each having an output coupled to an input of the other gate. Each gate has a second input coupled to its first input by a MOSFET having its gate electrode connected to a clock signal conductor. Thus, indeterminate voltages at the gate outputs are coupled during the appropriate clock signal to the input, that is, the set or reset input, to prevent the forbidden condition of both the set and the reset input from equaling a logical 1, resulting in an indeterminate state being written into the latch.

BRIEF DESCRIPTION OF THE INVENTION

Figure 1:
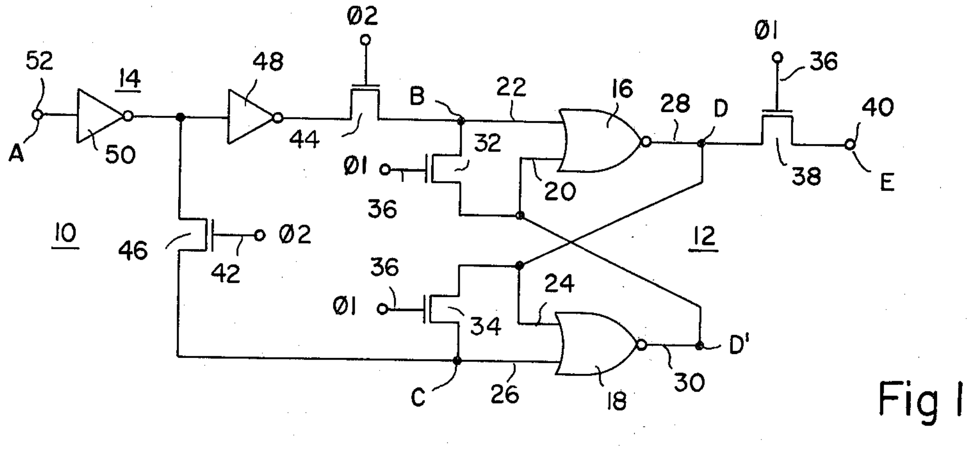
FIG. 1 is a schematic diagram of a preferred embodiment of the invention.

Referring to FIG. 1, in a preferred embodiment of the invention latch circuit 10 includes an RS flip-flop 12 including cross-coupled two input logic gates 16 and 18, which may be either NOR gates or NAND gates. Latch circuit 10 may be coupled to circuit 14 which produces complementary signals at the outputs of inverters 50 and 48, respectively, in response to a signal applied to input conductor 52.

Logic gate 16 has first and second inputs 20 and 22, respectively, and output 28; logic gate 18 has first and second inputs 24 and 26, respectively, and output 30. Output 28 is connected to input 24 and output 30 is connected to input 20. Output MOSFET 38 is coupled between output conductor 40 and output 28 of logic gate 16. The gate electrode of MOSFET 38 is connected to $\phi$1 conductor 36. MOSFET 32 is connected between inputs 20 and 22 and has its gate electrode connected to $\phi$1 conductor 36. MOSFET 34 is coupled between inputs 24 and 26 of logic gate 18 and has its gate electrode also connected to $\phi$1 conductor 36. MOSFET 44 is connected between input 22 and the output of inverter 48 and has its gate electrode connected to $\phi$2 conductor 42. MOSFET 46 is connected between input 26 and the output of inverter 50 and has its gate electrode connected to $\phi$2 conductor 42.

Figure 3A:
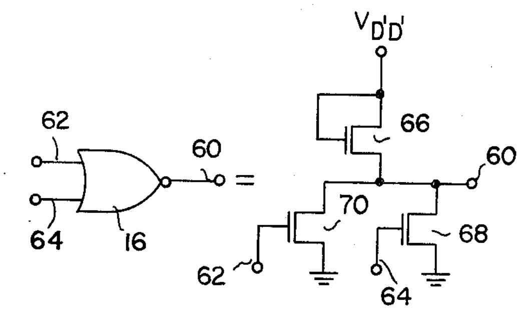
FIG. 3*a* is a schematic diagram depicting a MOSFET implementation of a two input NOR gate.

Logic gates 16 and 18 may be implemented with MOSFET devices, as illustrated in FIG. 3*a* which illustrates NOR gate 16 having output 60 and inputs 62 and 64. This device is readily implementable by connecting a diode-connected load MOSFET between a VDD voltage conductor and an output conductor 60 and by coupling switching MOSFETs 68 and 70 between output conductor 60 and a ground conductor. The inputs and outputs are labeled, respectively, by corresponding reference numerals.

Figure 3C:
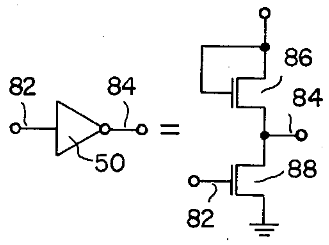
FIG. 3*c* is a diagram depicting a MOSFET implementation of an inverter.
Figure 3B:
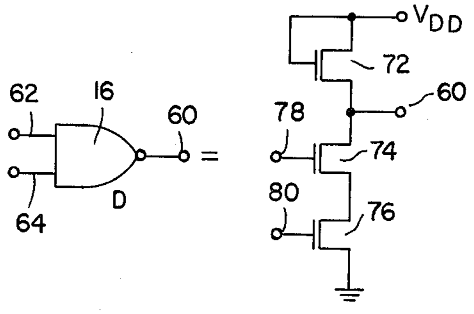
FIG. 3*b* is a schematic diagram depicting a MOSFET implementation of a two input NAND gate.

In an alternative embodiment, logic gates 16 and 18 can be MOSFET NAND gates, as depicted in FIG. 3*b*. Inverters 48 and 50 may also be implemented using MOSFET devices as indicated in FIG. 3*c*.

Figure 2:
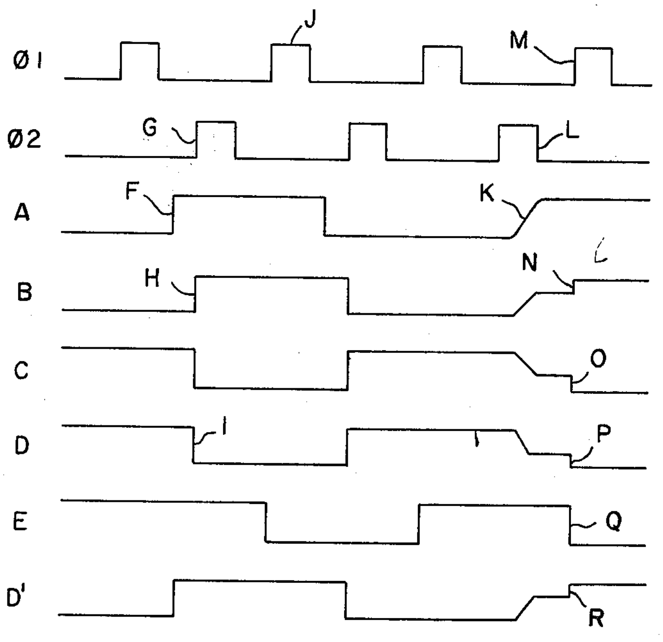
FIG. 2 is a timing diagram useful in describing the operation of the embodiment of FIG. 1.

The operation of the circuit of FIG. 1 is best described with reference to the timing diagram in FIG. 2. $\phi$1 and $\phi$2 are non-overlapping clock signals, which may be the same magnitude as VDD, as an example, VDD may be approximately 5 volts for state-of-the-art N-channel silicon gate MOS LSI manufacturing processes having MOSFET threshold voltages in the range from approximately 0.5 volts to 1.0 volts. The timing diagram in FIG. 2 illustrates the operation for a step input with 2.4 volts applied at node 52 and also for a ramp input applied thereat. Waveform A indicates such a waveform applied to node 52. Waveform B illustrates the resulting signal which occurs at input 22 indicated by reference letter B in FIG. 1. A complementary signal appears at input node 26 and is indicated by waveform C and reference letter C in FIG. 1. Assuming that inverters 50 and 48 respond sufficiently fast, when waveform A goes positive during the transition indicated by reference letter F from a logical 0 to a logical 1, the output of inverter 50 will go to a logical 0 and the output of inverter 48 will go to a logical 1. Then, at the leading edge of the first $\phi$2 pulse, indicated by reference letter G in FIG. 2, nodes B and C are coupled, respectively, to the outputs of inverters 48 and 50. Note that the waveforms in FIG. 2 correspond to an N-channel device. Consequently, node B goes from a logical 0 to a logical 1. When the $\phi$2 pulse disappears at the trailing edge of the first $\phi 2$ pulse the established charges remain stored on the capacitance associated with nodes B and C. The waveforms in FIG. 2 assume that the initial state of the RS flip-flop 12 was such that node D is initially a logical 1. Note that initially the logical levels on nodes B and C, which may be considered the set and reset inputs of the RS flip-flop 12, are of opposite polarity, so that the forbidden condition of the reset and set inputs both equaling a logical 1 is avoided. Similarly, after transition G of $\phi 2$, complementary levels are again established on nodes B and C and the forbidden condition, which results in an indeterminate state being written into the RS flip-flop 12 is avoided. Since input 20 of NOR gate 16 is initially at a logical 0, when waveform B goes positive during transition H thereof, output 28, node D, goes to a logical 0 during transition I which in turn causes input 24 to also go to a logical 0 and output 30 of NOR gate 18 to go to a logical 1 and the changing of the state of RS flip-flop 12 is at this point complete. Then, during $\phi 1$ pulse J, MOSFET 38 is turned on and node 40 is established at the same logic level as node 28, waveform D, and remains thereat after $\phi 1$ pulse J disappears. During this sequence of waveforms and related timing, no problems arise resulting in a possible indeterminate state being written into RS flip-flop 12.

However, during the next cycle illustrated in the waveforms of FIG. 2, a ramp input is illustrated for input waveform A, so that transition K is not complete by the end of the trailing edge L of waveform $\phi 2$, so that nodes B and C are left partially charged to indeterminate levels which may be either logical 1s or logical 0s. This is the classical forbidden condition for an RS flip-flop, and an indeterminate state will be written into RS flip-flop 12. According to the invention, level defining coupling MOSFETs 32 and 34 help to avoid this situation by coupling the potentials at nodes 30 and 28, respectively, to inputs 20 and 24 during leading edge M of $\phi 1$. First, it is clear that during the trailing edge of waveform A that waveforms B and C go, respectively, from a logical 1 to a logical 0 and from a logical 0 to a logical 1 during the following $\phi 2$ pulse. Then, during $\phi 1$ transition M, MOSFETs 32 and 34 are turned on, which causes the steep transitions N, O, P, and Q at, respectively, waveforms B, C, D and E.

While the invention has been described in relation to a particular embodiment thereof, those skilled in the art will recognize that variations in form to suit varying requirements may be made within the scope of the invention.

What is claimed is:

1. A latch circuit for producing, in response to an input signal, an output signal having a well-defined logic level cocmprising:

- first and second gates each having an output and first and second inputs, each gate having its output coupled to said first input of said other gate; and
- level-defining coupling means coupled between said output of one of said gates and said second input of the other of said gates for coupling an intermediate voltage at said output of said one gate to said second input of said other gate to determine the state of said latch circuit.

2. The latch circuit as recited in claim 1 further including circuit means for producing first and second complementary signals, including a first output coupled by coupling means to said second input of one of said gates and a second output coupled to said second input of the other of said gates.

3. The latch circuit as recited in claim 2 wherein said circuit means includes first and second inverters, the output of said first inverter being coupled to the input of said second inverter and to said second output, said second inverter having its output connected to said first output of said circuit means, said input signal being applied to an input of said first inverter.

4. The latch circuit as recited in claim 1 wherein said level-defining coupling means include a MOSFET coupled between said output of one of said gates and said second input of the other of said gates having its gate electrode coupled to a first clock signal conductor.

5. The latch circuit as recited in claim 1 further including second level-defining coupling means coupled between said output of the other of said gates and said second input of said one of said gates for coupling an intermediate voltage at said output of said other gate to said second input of said one gate to determine the state of said latch circuit.

6. The latch circuit as recited in claim 2 wherein said level-defining coupling means include a MOSFET coupled between an output of a first inverter and said second input of said other gate having its gate electrode coupled to a second clock signal conductor and including also a second MOSFET coupled between an output of a second inverter and said second input of said one gate having its gate electrode coupled to said second clock signal conductor.

7. The latch circuit as recited in claim 1 further including an output MOSFET coupled between an output of said latch circuit and said output of said one gate having its gate electrode coupled to a first clock signal conductor.

8. The latch circuit as recited in claim 1 wherein said first and second gates are NOR gates.

9. The latch circuit as recited in claim 1 wherein said first and second gates are NAND gates.

10. The latch circuit as recited in claim 8 wherein said NOR gates are comprised of MOSFETs.

11. The latch circuit as recited in claim 9 wherein said NAND gates are comprised of MOSFETs.

12. A MOSFET latch circuit for producing, for response to an input signal, an output signal having a well defined logic level comprising:

- a first MOSFET NOR gate having an output and first and second inputs;
- a second MOSFET NOR gate having an output and first and second inputs, said output of said first NOR gate being coupled to said first input of said second MOSFET NOR gate and said output of said second MOSFET NOR gate being coupled to said first input of said first MOSFET NOR gate;
- a first MOSFET coupled between said first and second inputs of said first MOSFET NOR gate having its gate electrode coupled to first clock signal conductor means; and
- a second MOSFET coupled between said first and second inputs of said second MOSFET NOR gate having its gate electrode coupled to said first clock signal conductor means.

13. The MOSFET latch circuit as recited in claim 12 further including an output MOSFET coupled between said output of said first MOSFET NOR gate and an output of said MOSFET latch circuit having its gate electrode coupled to said first clock signal conductor.

14. The MOSFET latch circuit as recited in claim 13 further including first and second MOSFET inverters coupled in series, said input signal being applied to an input of said first inverter, the output of said first inverter being coupled by a first coupling MOSFET having its gate electrode connected to second clock signal conductor means to said second input of said second MOSFET NOR gate, said output of said second MOSFET inverter being coupled by a second coupling MOSFET having its gate electrode connected to said second clock signal conductor to said second input of said first MOSFET NOR gate.

* * * * *